(12) United States Patent
Pai

(10) Patent No.: US 7,684,205 B2
(45) Date of Patent: Mar. 23, 2010

(54) SYSTEM AND METHOD OF USING A COMPLIANT LEAD INTERPOSER

(75) Inventor: Deepak K. Pai, Burnsville, MN (US)

(73) Assignee: General Dynamics Advanced Information Systems, Inc., Fairfax, VA (US)

( * ) Notice: Subject to any disclaimer, the term of this patent is extended or adjusted under 35 U.S.C. 154(b) by 727 days.

(21) Appl. No.: 11/358,723

(22) Filed: Feb. 22, 2006

(65) Prior Publication Data
US 2007/0193772 A1 Aug. 23, 2007

(51) Int. Cl.
*H01R 9/00* (2006.01)
(52) U.S. Cl. .................. 361/772; 361/767; 361/774; 361/760; 361/773; 361/728; 174/250; 174/263
(58) Field of Classification Search ................ 361/772, 361/774, 760, 767, 773, 776, 728, 729, 735, 361/742, 758; 174/260, 262, 263, 255, 259, 174/250
See application file for complete search history.

(56) References Cited

U.S. PATENT DOCUMENTS

| | | | |
|---|---|---|---|
| 4,462,534 A * | 7/1984 | Bitaillou et al. .......... | 228/180.1 |
| 5,283,717 A | 2/1994 | Hundt | |
| 5,468,681 A | 11/1995 | Pasch | |
| 5,800,184 A * | 9/1998 | Lopergolo et al. ............ | 439/66 |
| 5,953,214 A * | 9/1999 | Dranchak et al. ........... | 361/767 |
| 5,972,734 A | 10/1999 | Carichner et al. | |
| 6,103,554 A | 8/2000 | Son et al. | |
| 6,272,741 B1 * | 8/2001 | Kennedy et al. .............. | 29/830 |
| 6,303,878 B1 | 10/2001 | Kondo et al. | |

(Continued)

FOREIGN PATENT DOCUMENTS

JP 11-054553 2/1999

(Continued)

OTHER PUBLICATIONS

H-J. Albrecht "Alternative Lead Free Ball Materials with Improved Interface Properties"; pp. 1-7; Siemens AG, CT MM 6, Siemensdamm 50, 13623 Berlin Germany.

(Continued)

*Primary Examiner*—Dean A. Reichard
*Assistant Examiner*—Hoa C Nguyen
(74) *Attorney, Agent, or Firm*—Steptoe & Johnson LLP

(57) ABSTRACT

The present invention relates to a compliant leaded interposer for resiliently attaching and electrically connecting a ball grid array package to a circuit board. The interposer may include a substrate, a plurality of pads, and a plurality of pins. The plurality of pads may be positioned substantially on the top surface of the substrate and arranged in a predetermined pattern substantially corresponding to the solder ball pattern on the ball grid array package. The plurality of pins may be positioned substantially perpendicular to the substrate and may extend through the substrate and the plurality of pads. The interposer may be configured to attach the ball grid array package to the circuit board such that each of the solder balls on the ball grid array package contacts at least a portion the plurality of pins and at least a portion of the plurality of pads and such that the each of the plurality of pins also connects to a contact on the circuit board.

13 Claims, 4 Drawing Sheets

U.S. PATENT DOCUMENTS

| | | | |
|---|---|---|---|
| 6,337,445 B1 | 1/2002 | Abbott et al. | |
| 6,344,684 B1 | 2/2002 | Hussain et al. | |
| 6,354,844 B1 | 3/2002 | Coico et al. | |
| 6,365,978 B1 | 4/2002 | Ibnabdeljalil et al. | |
| 6,398,558 B1 | 6/2002 | Lemke et al. | |
| 6,400,019 B1 | 6/2002 | Hirashima et al. | |
| 6,428,327 B1 | 8/2002 | Tamarkin et al. | |
| 6,477,034 B1 | 11/2002 | Chakravorty et al. | |
| 6,503,070 B2 | 1/2003 | Eldridge et al. | |
| 6,525,407 B1 | 2/2003 | Drewery | |
| 6,531,763 B1 | 3/2003 | Bolken et al. | |
| 6,531,865 B1 | 3/2003 | Mai et al. | |
| 6,541,305 B2 | 4/2003 | Farooq et al. | |
| 6,583,354 B2 | 6/2003 | Alcoe | |
| 6,638,847 B1 | 10/2003 | Cheung et al. | |
| 6,700,079 B2 * | 3/2004 | Bogursky et al. | 174/268 |
| 6,710,456 B1 | 3/2004 | Jiang et al. | |
| 6,744,137 B2 | 6/2004 | Kinsman | |
| 6,768,205 B2 | 7/2004 | Taniguchi et al. | |
| 6,791,178 B2 | 9/2004 | Yamaguchi et al. | |
| 6,791,195 B2 | 9/2004 | Urushima | |
| 6,830,177 B2 | 12/2004 | Pai | |
| 6,982,380 B2 | 1/2006 | Hoffmann et al. | |
| 7,358,603 B2 * | 4/2008 | Li et al. | 257/698 |
| 7,462,783 B2 * | 12/2008 | Howard et al. | 174/260 |
| 2001/0028116 A1 | 10/2001 | Jiang | |
| 2002/0089827 A1 | 7/2002 | Brodsky | |
| 2002/0135063 A1 | 9/2002 | Alcoe | |
| 2002/0164838 A1 | 11/2002 | Moon et al. | |
| 2002/0179331 A1 | 12/2002 | Brodsky et al. | |
| 2002/0180027 A1 | 12/2002 | Yamaguchi et al. | |
| 2003/0049952 A1 | 3/2003 | Pai | |
| 2003/0049954 A1 | 3/2003 | Lin et al. | |
| 2003/0094692 A1 | 5/2003 | Ho et al. | |
| 2003/0116351 A1 | 6/2003 | Brodsky et al. | |
| 2003/0146017 A1 | 8/2003 | Fan et al. | |
| 2003/0146510 A1 | 8/2003 | Chien | |
| 2003/0146511 A1 | 8/2003 | Zhao et al. | |
| 2003/0173587 A1 | 9/2003 | Amagai et al. | |
| 2003/0196826 A1 | 10/2003 | Alcoe | |
| 2003/0197260 A1 | 10/2003 | Nishimura et al. | |
| 2003/0210531 A1 | 11/2003 | Alcoe et al. | |
| 2004/0012078 A1 | 1/2004 | Hortaleza | |
| 2004/0063247 A1 | 4/2004 | Emoto | |
| 2004/0094837 A1 | 5/2004 | Greer | |
| 2004/0124523 A1 | 7/2004 | Poo et al. | |
| 2004/0178492 A1 | 9/2004 | Tsukamoto et al. | |
| 2004/0195572 A1 | 10/2004 | Kato et al. | |
| 2004/0206988 A1 | 10/2004 | Glebov | |
| 2004/0245623 A1 | 12/2004 | Hara et al. | |
| 2005/0006739 A1 | 1/2005 | Howard et al. | |
| 2005/0151228 A1 | 7/2005 | Tanida et al. | |
| 2005/0189633 A1 | 9/2005 | Wang et al. | |
| 2006/0001179 A1 | 1/2006 | Fukase et al. | |
| 2006/0012039 A1 | 1/2006 | Kim et al. | |

FOREIGN PATENT DOCUMENTS

| | | |
|---|---|---|
| WO | WO 97/37373 | 10/1997 |
| WO | WO 02/15653 | 2/2002 |
| WO | WO 2004/097937 | 11/2004 |

OTHER PUBLICATIONS

ISI "RoHS/Lead Free Solutions" p. 1; Interconnected Systems, Inc. 708 Via Alondra, Camarillo, CA 93012 ; www.isipkg.com.

PCT Search Report.

International Bureau of WIPO, "International Preliminary Report on Patentability," mailed Sep. 4, 2008.

* cited by examiner

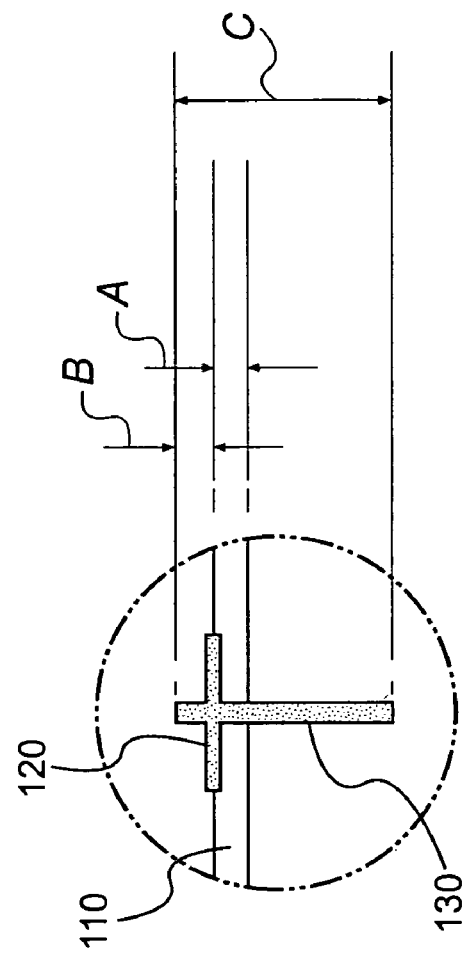
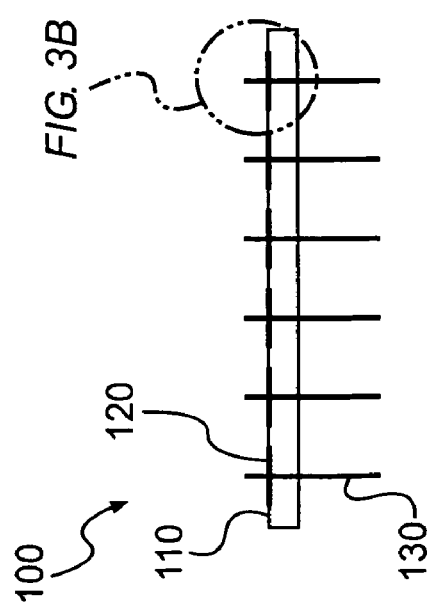
FIG. 3B
FIG. 3A

SYSTEM AND METHOD OF USING A COMPLIANT LEAD INTERPOSER

FIELD OF THE INVENTION

The present invention is related to electromechanical leads connecting integrated circuit packages to printed wire boards, and more particularly to a method of attaching a compliant leaded interposer to a plastic ball grid array in order to compensate for non-coplanarity or warpage.

BACKGROUND OF THE INVENTION

Early attempts at mounting and connecting integrated circuits and semiconductor chips to printed wiring boards (PWBs) frequently resulted in unreliable connections. More particularly, attempts at connecting commercial-off-the-shelf ("COTS") large-size, high-pin-count ("HPC") plastic ball grid arrays (PBGAs) to PWBs included additional difficulties during attachment and use due certain characteristics to the PBGAs. Some of the COTS PBGAs display warpage and non-coplanarity, which may cause shorting and/or structural weaknesses after soldering. These difficulties may be enhanced or exaggerated when the PWBs are exposed to harsh environments, such as environments having thermal cycling and mechanical vibrations.

Non-coplanarity in a PBGA is measured by the largest distance between a given ball and a theoratical plane formed by three highest balls. Non-coplanarity may be observed by placing a PBGA on a flat plate or surface where only three balls make contact with the flat plate. The non-coplanarity prevents other balls from contacting the surface, leaving a gap. Non-coplanarity may, however, change during thermal cycling, depending in some cases on the thermal coefficient of expansion mismatch of the materials used in the PBGA, such as silicon, substrate, encapsulant, and die adhesive and structural inconsistencies.

In some cases, the COTS PBGAs, "as received" from the manufacturer, include non-coplanarity characteristics even at room temperature. COTS components, despite following commercial standards, may display deviations of 0.004 inch for a small-size COTS PBGA, which for 0.020 inch diameter solder balls indicates a 0.004/0.020 deviation or 20% non-coplanarity. For small-size COTS PBGA, this deviation, equaling approximately ⅕th of the height of the joint, results in a weak joint between corresponding contacts on the PBGA and the PWB. For large-size COTS PBGA, the problem may be exaggerated with the deviation from coplanarity exceeding 0.006 in some cases. The PGBAs may experience additional warpage during soldering when localized temperatures may increase dramatically. For example, the soldering temperature may range from about 215° C. to about 220° C. for Tin 63%:Lead 37% solder and about 245° C. to about 250° C. for lead-free Tin:Silver:Copper (SAC) alloy. At these soldering temperatures, previously planar PBGAs may experience new warpage and originally warped PBGAs may further deform, exacerbating the issue.

FIG. 1A shows an example of a PBGA prior to soldering to a PWB. As shown in FIG. 1, a PBGA 10 may include an encapsulant 11, a substrate 12 and solder balls 13. Although the PBGA 10 may be coplanar at room temperature when received from the manufacturer, the PBGA may warp during soldering when localized temperatures increase. As shown in FIG. 1A, for most COTS PBGA the encapsulant 11 does not extend across the entire upper surface of the substrate 12. As such, the substrate 12 has been shown to experience localized warpage of the outer portions of the substrate 12 without the encapsulant 11 during soldering of the solder balls 13.

FIG. 1B shows the effects of warpage on the quality of the solder joints. As shown, the PBGA 10 may warp during or after soldering, especially at the edges of the PBGA 10, with the substrate 12 departing from coplanarity. For example in FIG. 1B, at the edges of the PBGA 10, a distinctive downward curve is shown. This downward warpage may cause shorts in the electrical circuits if the solder balls 13 flatten and touch one another as shown in FIG. 1 when the PBGA is soldered to the PWB 30. Alternatively, if the PBGA is warped with an upward curve (not shown in the figures), the solder ball may fail to make contact with the PWB, resulting in a gap or open circuit.

If a warped or non-coplanar PBGA is received from the manufacturer and soldered to a PWB in the normal process, the warpage may be exaggerated during the soldering process and compound the problem. In COTS HPC PBGA, the warpage due to the soldering process may be difficult to predict due to several variables associated with the materials and processes. For example, the PBGA typically warps at the usual 215° C. to 220° C. soldering temperature. However, even when cooling from about 183° C., the temperature at which typical solder solidifies, to room temperature, the PBGA may continue to warp, inducing stress into the solder joints. Further, repeated thermal cycling, such as for example from −40° C. to +100° C., during actual use may induce additional warping in the PBGA and result in stressed solder joints due to repeated warping and unwarping actions.

Even if the induced warpage or non-coplanarity is not sufficient to cause a short or gap, a non-coplanar PBGA may induce greater stress and strain on the solder joints used to attach the PBGAs to the PWBs. Typically, PBGAs and PWBs have different thermal coefficients of expansion (TCE), resulting in problems when exposed to harsh thermally cyclic environments and vibration. When warped or non-coplanar PBGAs experience thermal expansion and contraction, the individual solder joints the PBGA to the PWB often experience different amounts of stress and strain. Stresses induced by thermal cycling, vibration and shock during use limit the life of the solder joint and the reliability of the system. Highly stressed, weak solder joints inherently include a lower life expectancy. Over time, degradation and cracking results at the solder joints from temperature cycling, especially where localized warping of the PBGA has already induced stress on the solder joints. As a result, the thermal expansion and contraction experienced by the solder joints increases with the amount of warpage of the PBGA, resulting in possible mechanical and electrical failure over time.

Previous attempts to connect certain components to PWBs have included the use of compliant leaded interposers. Such compliant leaded interposers have included etched leads, formed from thin copper leaf, which directly connect the electrical contacts on lightweight components, such as chip scale packages, to the electrical contacts on the PWB. An example of such a compliant leaded interposer is taught in U.S. Pat. No. 6,830,177. However, the thin etched leads of previously taught interposers are incapable of supporting larger components, such are large area grid array components. More particularly, the previously taught interposers fail to provide sufficient mechanical support and robustness for heavy PBGA components used in may advance electronic packages.

Therefore, it would be desirable to compensate for warpage or non-coplanarity in PBGA and to provide a robust mechanical and electrical connection between the PBGA and the PWB after soldering.

SUMMARY OF THE INVENTION

The present invention is related to a compliant leaded interposer for resiliently attaching and electrically connecting a ball grid array package to a circuit board where the ball grid array package includes solder balls arranged in a solder ball pattern. The compliant leaded interposer may include a substrate having a top surface and a bottom surface and a plurality of pads positioned substantially on the top surface of the substrate and arranged in a predetermined pattern substantially corresponding to the solder ball pattern with each of the plurality of pads being associated with one of the solder balls. The interposer may also include a plurality of pins positioned substantially perpendicular to the top surface of the substrate and extending through the substrate and the plurality of pads. The plurality of pins may be arranged in the predetermined pattern with each of the plurality of pins being associated with one of the solder balls and each of the plurality of pins may include a first end configured to extend a first distance beyond the top surface of the substrate and a second end configured to extend a second distance beyond the bottom surface of the substrate. The interposer may be configured to attach the ball grid array package to the circuit board such that each of the solder balls contacts at least a portion the first end of one of the plurality of pins and at least a portion of one of the plurality of pads and such that the second end of each of the plurality of pins attaches to an associated contact on the circuit board.

In another embodiment of the present invention, a method of connecting a grid array package to a printed wiring board (PWB) includes the steps of aligning a compliant leaded interposer in an assembly tool. The interposer may include a plurality of pins positioned substantially perpendicular to a substrate and extending through the substrate. Each of the plurality of pins may include a first end configured to extend a first distance beyond a top surface of the substrate and a second end configured to extend a second distance beyond a bottom surface of the substrate. Further, each of the plurality of pins may include a pad aligned with the pin and positioned substantially on the top surface of the substrate. The assembly tool may include a plurality of holes in a plate member configured to receive the second end of the plurality of pins in a predetermined pattern. The method may also include the steps of orienting a plurality of solder balls on the grid array package with the first end of the plurality of pins using tooling pins mounted on the plate member of the assembly tool and electrically connecting each of the plurality of solder balls to the first end of one of the plurality of pins and to at least a portion of one of the plurality of pads. The method may then include removing the interposer and the ball grid array package from the assembly tool and orienting the second end of each of the plurality of pins with at least one conductive contact on the PWB. Finally, the method may include electrically connecting the second end of each of the plurality of pins to at least one conductive contact of the PWB thereby establishing an electrical connection between the ball grid array package and the PWB. The plurality of pins may define a space between the PWB and the bottom surface of the substrate of the interposer.

These and other objects and advantages of the invention will be apparent from the following description, the accompanying drawings and the appended claims.

BRIEF DESCRIPTION OF THE DRAWINGS

While the specification concludes with claims particularly pointing out and distinctly claiming the present invention, it is believed the same will be better understood from the following description taken in conjunction with the accompanying drawings, which illustrate, in a non-limiting fashion, the best mode presently contemplated for carrying out the present invention, and in which like reference numerals designate like parts throughout the Figures, wherein:

FIGS. 3A shows a side view of the compliant leaded interposer shown in FIG. 2

FIG. 3B shows an enlarged side view of the a portion of the compliant leaded interposer shown in FIG. 3A;

DETAILED DESCRIPTION OF THE INVENTION

The present disclosure will now be described more fully with reference to the Figures in which various embodiments of the present invention are shown. The subject matter of this disclosure may, however, be embodied in many different forms and should not be construed as being limited to the embodiments set forth herein.

The present invention relates to a method and system for mounting plastic ball grid arrays ("PBGA") to circuit boards or printed wiring boards and more particularly to using a compliant leaded interposer for compensating for non-coplanarity or warpage of a PBGA.

Figure 1A:
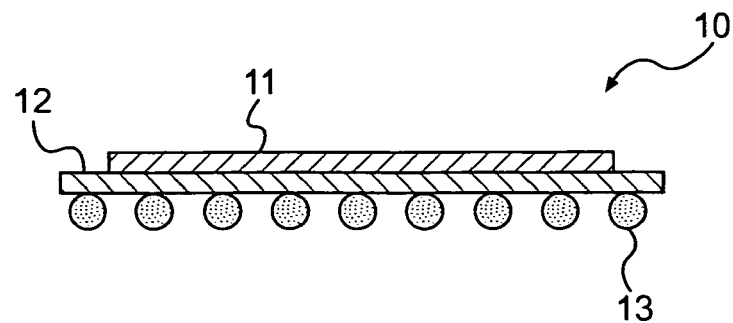
FIG. 1A shows a side view of a plastic ball grid array prior to soldering on a printed wiring board.
Figure 1B:
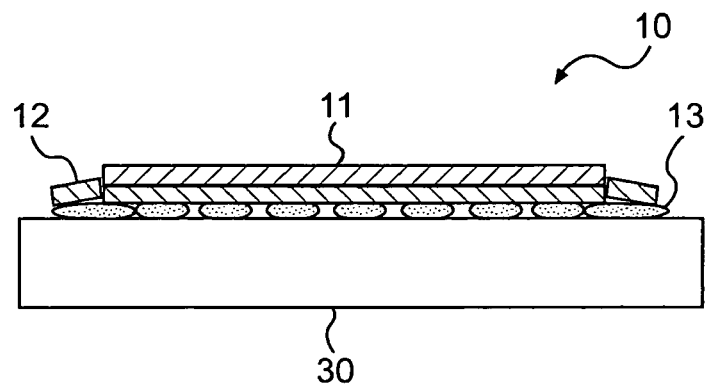
FIG. 1B shows a side view of a plastic ball grid array soldered on a printed wiring board.
Figure 2:
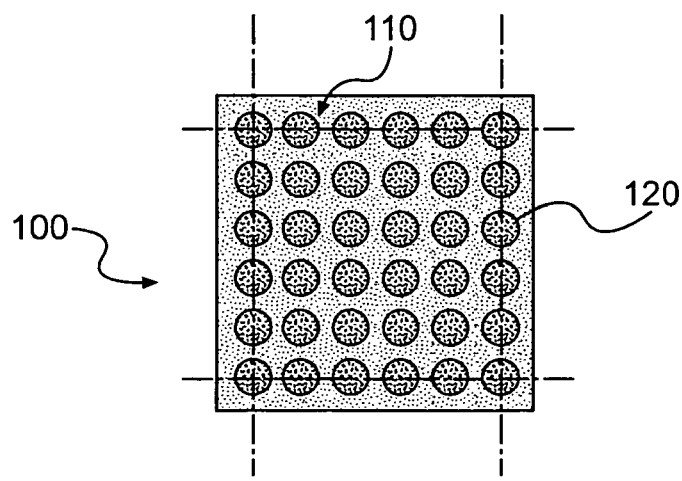
FIG. 2 shows a top view of the compliant leaded interposer in accordance with one embodiment of the present invention.

FIG. 2 shows an interposer 100 in accordance with one embodiment of the present invention. As shown, the interposer 100 includes an interposer substrate 110, copper pads 120, and compliant pins 130 (shown in FIG. 3A). In accordance with the present invention, the substrate may be formed from a laminate material with or without fiber-glass reinforcement, which may be commercially obtained to match as closely as possible the TCE of the PBGA and/or ceramic ball grid array (CBGA). The substrate may also be formed from high temperature FR4 such as Nelco 4000-13. Other material known to those of skill in the art may be used including, but no limited to, Bismatemide Triazine (BT), Polyamide and Cyanate Ester. The copper pads 120 and the compliant pins 130 may be arranged in the pattern shown in FIG. 2. As would be obvious to one of skill in the art, the arrangement of the pads 120 and pins 130 may be configured to match that of the PBGA and the PWB.

Referring to FIG. 3A, a side view of the interposer 100 from FIG. 2 is shown. The compliant pins 130 are configured to extend through the substrate 110 and the pads 120, extending a predetermined amount above the surface of the substrate 110. In accordance with one embodiment of the present invention, the compliant pins 130 may be 0.012 inches in diameter and 0.088 inches in length. The pins 130 may be formed from electrically conductive materials known to those of skill in the art such as Be:Cu alloy, pure copper, phosphorus bronze, and Cu:Be alloys. The pins may also be surface finished with materials known to those of skill in the art such as Ni:Au, Ni:Pd:Au, Sn:Pb, Ag and Sn, depending on the application. Further, the pins may include a less than 20 microinch gold finish.

As shown in FIGS. 3A and 3B, the pads 120 are positioned on only one side of the substrate 110. The copper pads may be formed from copper with a liquid solder mask or other suitable materials known to those of skill in the art. Further, in one embodiment, the pads 120 are configured at about a 0.025 inch diameter for each pad 120 if a pitch of 0.050 inch is used for spacing on the PBGA. If a 0.040 inch pitch is used, a diameter of about 0.020 inch may be used for the diameter of the pads 120. It should be understood that alternative pitches and pad sizes may be used without deviating from the scope and spirit of the present invention.

FIG. 3B shows a blown up view of a portion of the interposer 100. A single compliant pin 130 is shown extending a distance B above the upper surface of the substrate 110, which includes a thickness A. The length C of the pin defines the total height of the interposer 100. The distance B may vary depending on the pitch used. For example, the distance B may be about 0.010 inch for a pitch of 0.050 inch and about 0.008 inch for a pitch of 0.040 inch. In accordance with one embodiment of the present invention, the thickness A of the substrate 110 may be about 0.010 inch and the length C of the pin may be about 0.070 inch to about 0.100 inch. It should be understood that other dimensions for the interposer may be used without deviating from the scope and spirit of the present invention.

FIG. 3B also shows that the pads 120 are embedded at least partially into the surface of substrate 110.

Figure 4A:
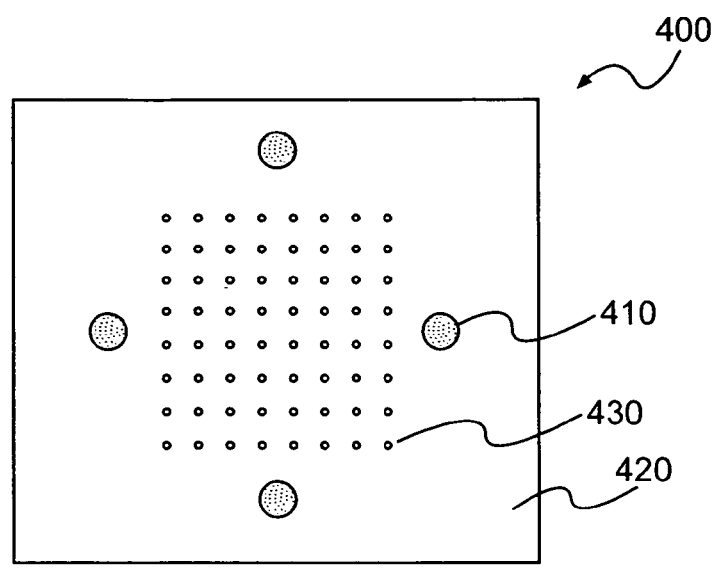
FIG. 4A shows a top view of an assembly tool in accordance with another embodiment of the present invention.
Figure 4B:
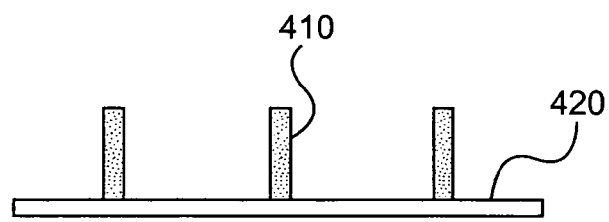
FIG. 4B shows a side view of the assembly tool shown in FIG. 4A.

Referring to FIG. 4A, top view of a soldering tool 400 is shown. The soldering tool 400 includes four tooling pins 410 mounted on an alignment plate 420. In accordance with one embodiment of the present invention, the tooling pins 410 may be about 0.030 inch diameter. Further, the alignment plate 420 may include about 0.015 inch diameter holes 430, which are configured to match the pin pattern of the interposer footprint. The alignment plate 420 may be formed from about 0.060 inch aluminum plate or other suitable material known to one of skill in the art. As shown in FIG. 4A, which shows a side view of the assembly tool, the tooling pins 410 may be configured to extend above the surface of the alignment plate 420.

Figure 5:
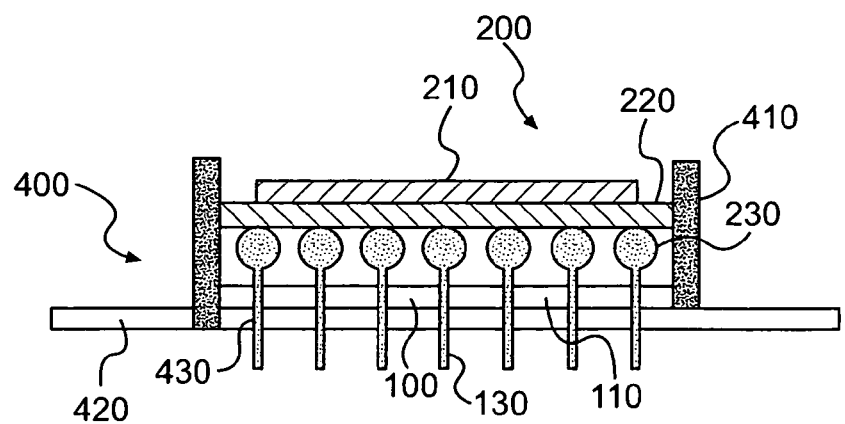
FIG. 5 shows the compliant leaded interposer of FIG. 2 positioned in the assembly tool of FIG. 4 with a ball grid array package positioned prior to soldering in accordance with one embodiment the present invention.

FIG. 5 shows a cross-section view of the PBGA 200, the interposer 100, and the soldering tool 400 with the PBGA 200 being aligned on the interposer 100 using the soldering tool 400. The PBGA 200 is shown positioned between the tooling pins 410, allowing the PBGA 200 to be properly aligned over the interposer such that the soldering balls 230 are aligned with the compliant pins 130 of the interposer 100. The pins 130 of the interposer 100 are shown aligned and inserted into the holes 430 of the alignment plate 420 of the soldering tool 400. Once aligned and positioned as shown in FIG. 5, the soldering balls 230 of the PBGA 200 may be soldered to the interposer 100 using soldering processes and techniques known to those of skill in the art.

Although not visible in FIG. 5, it should be understood that the copper pads 120 of the interposer 100 are positioned on the top surface of the interposer 100 and are intended to make contact with the soldering balls 230 once soldering is complete. The solder balls 230 of the PBGA 200 may be formed from Tin 63%:Lead 37% with a soldering temperature of 215° C. to 220° C. or lead-free Tin:Silver:Copper (SAC) alloy solder with a soldering temperature of 245° C. to 250° C. Alternatively, other solders may be used without deviating from the scope and spirit of the present invention.

Figure 6:
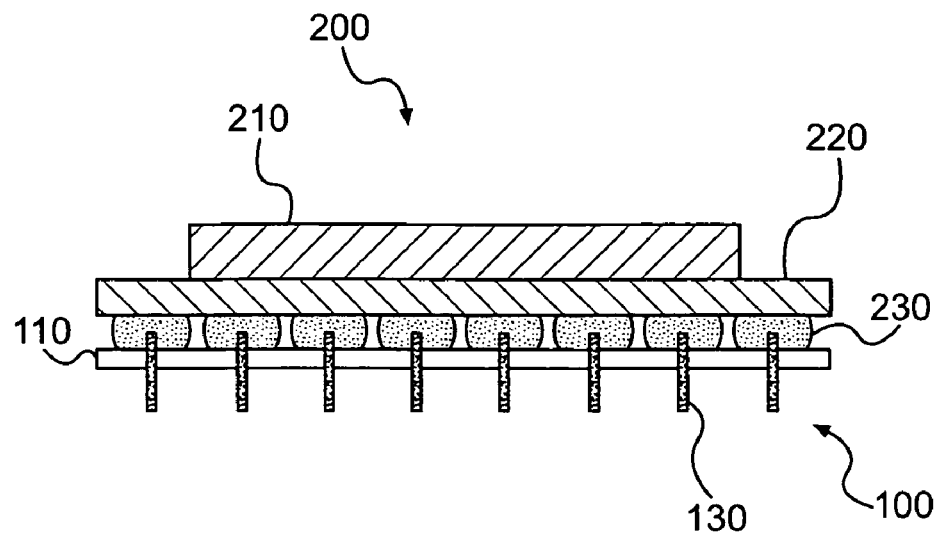
FIG. 6 shows the assembled compliant leaded interposer and the ball grid array in accordance with the present invention.

The soldered assembly of the PBGA 200 and the interposer 100 is shown in FIG. 6 according to one embodiment of the present invention. It should be understood that the portion of the compliant pin 130 extending above the surface of the substrate 110 the distance B extends into the solder joint or solder ball 230, securely making a mechanical connection and an electrical connection. This distance B serves to accommodate warping in the PBGA and help form a joint between the interposer solder pad 120 and the PBGA pad/contact. The distance B also serves to reinforcement of the conductive pin and the solder joint between the interposer and the PBGA. The distance B helps reduce the possibility of a gap or open circuit forming in the event the PBGA 200 warps upward away from the interposer 100. By extending beyond the top surface of the substrate 1O of the interposer 100, the compliant pin 130 increases the likelihood of contact with the solder ball 230 without reducing the distance between the substrate 220 and the substrate 10. As shown in FIG. 6, the assembly is ready to be soldered to the PWB. The distance of the pin below the substrate (C−(A+−B)) may be intentionally kept long for compliancy of the pin and to accommodate thermal cycling and TCE mismatch.

Figure 7:
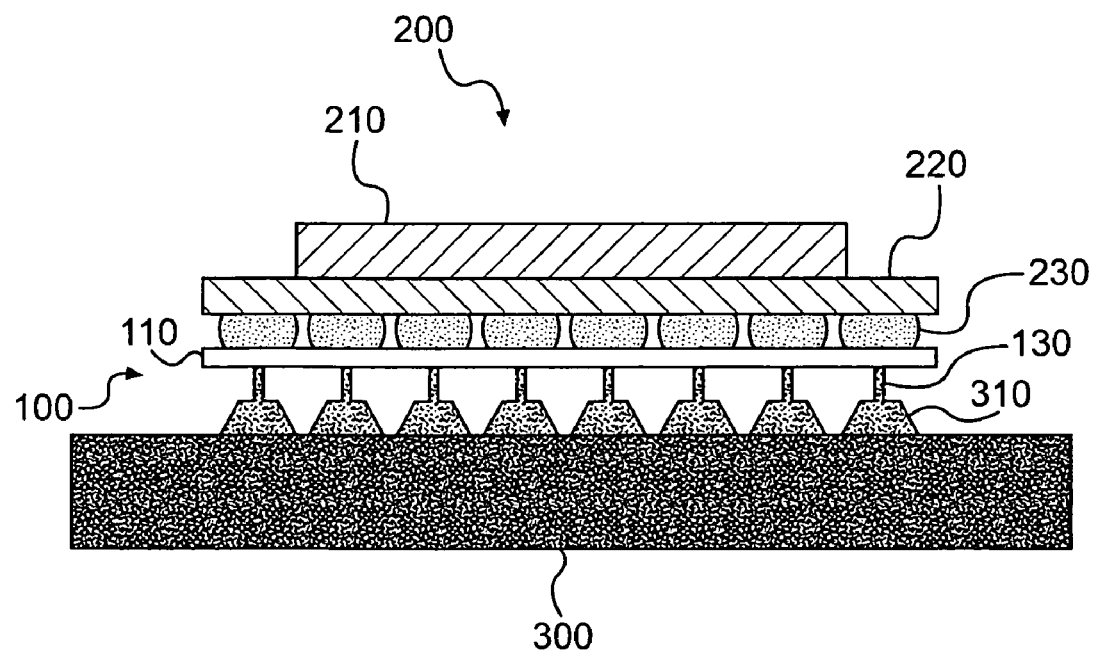
FIG. 7 shows the assembled compliant leaded interposer and the ball grid array soldered to the printed wiring board in accordance with the present invention.

Referring to FIG. 7, the assembly of the PBGA 200 and the interposer 100 is shown in a side view soldered to the PWB 300. The solder 310 mechanically and electrically connects the pins 130 of the interposer 100 to contacts on the PWB 300. The soldering of the interposer 100 to the PWB 300 may be performed according to the typical soldering process known to those of skill in the art. As would be apparent to one of ordinary skill in the art, the present invention may be configured to be used with various ball arrangements including full grid ball arrangements, perimeter ball arrangements, or other ball arrangements.

It should be understood that the compliant pins 130 are configured to provide sufficient compliance between the PBGA 200 and the PWB 300 during thermal cycling. The stresses and strains caused by the different thermal expansions and contractions of the PBGA 200 and the PWB 300, due to different TCEs, may be absorbed by the pins 130 of the interposer 100 rather than the solder joints 230 and 310. As such, the compliant interface between the PBGA 200 and the PWB 300 provides a robust and efficient mechanical and electrical connection that resists damage due to thermal cycling and compensates for variations in the coplanarity of the PBGA.

It should be understood that the compliant interposer in accordance with the present invention may be used with other grid ball array components without deviating from the scope and spirit of the present invention. For example, the interposer 100 may be used with a CBGA using lead-free solder balls such as tin:silver:copper (SAC). Since the ball grid array (BGA) are soldered twice, a step soldering process known to those of skill in the art may use two different alloys of two different melting temperatures to effectively solder the BGA The foregoing descriptions of specific embodiments of the present invention are presented for purposes of illustration and description. They are not intended to be exhaustive or to limit the invention to the precise forms disclosed. Obviously, many modifications and variations are possible in view of the above teachings. While the embodiments were chosen and described in order to best explain the principles of the invention and its practical applications, thereby enabling others skilled in the art to best utilize the invention, various embodiments with various modifications as are suited to the particular use are also possible. The scope of the invention is to be defined only by the claims appended hereto, and by their equivalents.

What is claimed is:

1. A compliant leaded interposer for resiliently attaching and electrically connecting a ball grid array package to a circuit board, the ball grid array package having solder balls arranged in a solder ball pattern, the compliant leaded interposer comprising:
a substrate having a top surface and a bottom surface;
a plurality of pads positioned substantially on the top surface of the substrate and arranged in a predetermined pattern substantially corresponding to the solder ball pattern, each of the plurality of pads being associated with one of the solder balls, each of the plurality of pads being at least partially embedded into the substrate; and
a plurality of pins positioned substantially perpendicular to the top surface of the substrate and extending through the substrate and the plurality of pads, the plurality of pins being arranged in the predetermined pattern with each of the plurality of pins being associated with one of the solder balls, each of the plurality of pins having a first end configured to extend a first distance beyond the top surface of the substrate and a second end configured to extend a second distance beyond the bottom surface of the substrate;
wherein the interposer is configured to attach the ball grid array package to the circuit board such that each of the solder balls contacts at least a portion the first end of one of the plurality of pins and at least a portion of one of the plurality of pads and such that the second end of each of the plurality of pins attaches to an associated contact on the circuit board.

2. The compliant leaded interposer according to claim 1, wherein the ball grid array package is a plastic ball grid array package.

3. The compliant leaded interposer according to claim 1, wherein the ball grid array package is a ceramic ball grid array package.

4. The compliant leaded interposer according to claim 1, wherein each of the plurality of pins is substantially aligned with a centerline of at least one of the plurality of pads.

5. The compliant leaded interposer according to claim 4, wherein the plurality of pins are formed from at least one of pure copper, berillium:copper alloy, and phosphorus bronze alloy.

6. The compliant leaded interposer according to claim 5, wherein the plurality of pins are surface finished with at least one of pure tin, silver, nickel:palledium:gold, nickel:gold, and gold.

7. The compliant leaded interposer according to claim 1, wherein the substrate is formed from a laminate layer.

8. The compliant leaded interposer according to claim 1, wherein each of the plurality of pins includes a diameter of approximately 0.012 inch and a length of approximately 0.088 inch.

9. The compliant leaded interposer according to claim 1, wherein each of the plurality of pads includes a diameter of approximately 0.025 inch when a pitch of approximately 0.050 inch is used for the solder balls.

10. The compliant leaded interposer according to claim 1, wherein each of the plurality of pads includes a diameter of approximately 0.020 inch when a pitch of approximately 0.040 inch is used for the solder balls.

11. The compliant leaded interposer according to claim 1, wherein the plurality of pads include copper and are surface finished with at least one of pure tin, immersion silver, tin:lead, nickel;palladium:gold, and nickel:gold.

12. The compliant leaded interposer according to claim 1, wherein the first distance is approximately 0.010 when a pitch of approximately 0.050 inch is used for the solder balls.

13. The compliant leaded interposer according to claim 1, wherein the first distance is approximately 0.008 when a pitch of approximately 0.040 inch is used for the solder balls.

* * * * *